US008638577B2

(12) United States Patent
Shiraishi et al.

(10) Patent No.: US 8,638,577 B2
(45) Date of Patent: Jan. 28, 2014

(54) SEMICONDUCTOR DEVICE FOR DC-DC CONVERTER INCLUDING HIGH SIDE AND LOW SIDE SEMICONDUCTOR SWITCHES

(75) Inventors: Masaki Shiraishi, Hitachinaka (JP); Takayuki Hashimoto, Tokai (JP); Noboru Akiyama, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/230,947

(22) Filed: Sep. 13, 2011

(65) Prior Publication Data

US 2012/0001609 A1   Jan. 5, 2012

Related U.S. Application Data

(63) Continuation of application No. 12/818,803, filed on Jun. 18, 2010, now Pat. No. 8,049,479, which is a continuation of application No. 11/624,837, filed on Jan. 19, 2007, now Pat. No. 7,821,243.

(30) Foreign Application Priority Data

Feb. 23, 2006   (JP) ................................. 2006-046171

(51) Int. Cl.
*H02M 1/38* (2007.01)
*H02M 3/155* (2006.01)

(52) U.S. Cl.
USPC .......................... 363/56.04; 363/147; 323/271

(58) Field of Classification Search
USPC ............... 323/271, 282, 283; 363/56.04, 147; 361/18; 257/479
See application file for complete search history.

(56) References Cited

U.S. PATENT DOCUMENTS

| 5,805,434 | A  | 9/1998  | Vinciarelli et al. |
| 6,603,291 | B2 | 8/2003  | Wheeler et al. |
| 6,639,295 | B2 | 10/2003 | Majumdar et al. |
| 6,882,047 | B2 | 4/2005  | Hata et al. |

(Continued)

FOREIGN PATENT DOCUMENTS

| JP | 8-97351  | 4/1996 |
| JP | 9-65649  | 3/1997 |

(Continued)

OTHER PUBLICATIONS

Machine translation of JP 2005-093762 A. Obtained from http://dossier1.ipdl.inpit.go.jp/AIPN/odse_top_dn.ipdl?N0000=7400 on Nov. 26, 2012.*

(Continued)

*Primary Examiner* — Adolf Berhane
*Assistant Examiner* — Fred E Finch, III
(74) *Attorney, Agent, or Firm* — Antonelli, Terry, Stout & Kraus, LLP.

(57) ABSTRACT

In a non-isolated DC/DC converter, a reference potential for a low-side pre-driver which drives a gate of a low-side MOSFET is applied from a portion except for a main circuit passing through a high-side MOSFET and the low-side MOSFET so that a parasitic inductance between a source of the low-side MOSFET and the pre-driver is increased without increasing the sum of parasitic inductances in the main circuit and negative potential driving of the gate of the low-side MOSFET can be performed and a self turn-on phenomenon can be prevented without adding any member and changing drive system.

8 Claims, 11 Drawing Sheets

(56) References Cited

U.S. PATENT DOCUMENTS

| | | |
|---|---|---|
| 7,436,070 B2 | 10/2008 | Uno et al. |
| 7,514,731 B2 | 4/2009 | Shiraishi et al. |
| 7,821,243 B2 | 10/2010 | Shiraishi et al. |
| 2004/0125573 A1* | 7/2004 | Joshi et al. .................. 361/723 |
| 2004/0227547 A1 | 11/2004 | Shiraishi et al. |
| 2005/0083024 A1 | 4/2005 | Harris et al. |
| 2005/0135037 A1* | 6/2005 | Thiery et al. .................. 361/94 |
| 2005/0194951 A1 | 9/2005 | Mehas et al. |
| 2006/0006432 A1* | 1/2006 | Shiraishi et al. .............. 257/288 |
| 2009/0179235 A1 | 7/2009 | Shiraishi et al. |
| 2009/0251119 A1* | 10/2009 | Stojcic et al. ................ 323/282 |

FOREIGN PATENT DOCUMENTS

| | | |
|---|---|---|
| JP | 2002-290224 | 10/2002 |
| JP | 2003-124436 | 4/2003 |
| JP | 2004-015974 | 1/2004 |
| JP | 2004-342735 | 12/2004 |
| JP | 2005/093762 | 4/2005 |
| JP | 2005310907 | 11/2005 |
| JP | 2006-25567 | 1/2006 |

OTHER PUBLICATIONS

"Complementary MOSFET Driver and Synchronous Half-Bridge Switch," INTERSIL Data Sheet—Feb. 2003—FN9082.2 [ISL6571] (11 pages); in English.

Maxim Integrated Products. "Layout Considerations of Non-Isolated DC-DC Converters." Application Note 735.01 Mar. 2001. Web site: http://pdfserv.maxim-ic.com/en/an/AN735.pdf.

Office Action in JP 2010-175293, issued Jul. 4, 2012 (in Japanese, 3 pgs.), [English language translation, 3 pgs.].

* cited by examiner

LOW-SIDE MOSFET OFF

HIGH-SIDE MOSFET ON

SEMICONDUCTOR DEVICE FOR DC-DC CONVERTER INCLUDING HIGH SIDE AND LOW SIDE SEMICONDUCTOR SWITCHES

CROSS-REFERENCE TO RELATED APPLICATION

This application is a continuation of U.S. application Ser. No. 12/818,803, filed Jun. 18, 2010, now U.S. Pat. No. 8,049,479 which, in turn, is a continuation of U.S. application Ser. No. 11/624,837, filed Jan. 19, 2007 (now U.S. Pat. No. 7,821,243) and which application claims priority from Japanese Patent Application No. JP 2006-046171 filed on Feb. 23, 2006, the contents of which are hereby incorporated by reference into this application.

TECHNICAL FIELD OF THE INVENTION

The present invention relates to a technique for a non-isolated DC/DC converter, and in particular to a technique effectively applied to a circuit system and a mounting system which can prevent a self turn-on phenomenon without adding any new member or changing a driving system.

BACKGROUND OF THE INVENTION

For example, a non-isolated DC/DC converter used in power source circuit for a desktop PC, a notebook PC, a game machine, or the like is in a trend of large current use and high frequency use according to demand for large current use in a CPU (Central Processing Unit) or an MPU (Micro Processing Unit) or demand for size reduction of a choke coil or an input/output capacitor which is a passive part. The DC/DC converter is composed of a high-side switch and a low-side switch, where a power MOSFET is used in each of the switches.

The switches are alternately turned ON/OFF to perform voltage conversion while synchronizing the high-side and low-side switches with each other. The high-side switch is a switch for controlling the DC/DC converter and the low-side switch is a switch for synchronization and rectification.

A recent DC/DC converter is in a trend for advance to the system-in-package obtained by packaging a high-side switch, a low-side switch, and a driver IC for driving the switches in one package in order to reduce parasitic inductances among chips and satisfy high-speed response and size reduction.

FIG. 10 is a circuit diagram of a DC/DC converter using a conventional system-in-package. A system-in-package 1 comprises a high-side MOSFET 2, a low-side MOSFET 3, and pre-drivers 4 and 5 which drive the respective MOSFETs. Here, the pre-drivers 4 and 5 are formed in a driver IC 6 as one chip, and three chips of the high-side MOSFET 2, the low-side MOSFET 3, and the driver IC 6 are mounted in one package.

An operation principle and respective constituent elements of a DC/DC converter using the system-in-package will be explained. The pre-drivers 4 and 5 drive gates of the high-side MOSFET 2 and the low-side MOSFET 3 via wires 7 and 9 according to input of a PWM signal from a PWM controller 11. Source potentials of the high-side MOSFET 2 and the low-side MOSFET 3 are inputted to the pre-drivers 4 and 5 via wires 8 and 10, and respective gate voltages thereof are applied based upon the source potentials. A voltage (VIN) applied to an input terminal 25 via an input capacitor 14 is converted to a desired voltage according to a ratio of an ON period between the high-side MOSFET 2 and the low-side MOSFET 3 to be outputted to an output terminal 26. The outputted voltage is smoothed by a choke coil 13 and an output capacitor 12 so that an output voltage (VOUT) is outputted. A power ground terminal 27 connected to a power ground 29 and a logic ground terminal 28 connected to a logic ground 30 are provided, respectively.

FIG. 11 is a diagram showing a configuration example of a system-in-package for the conventional DC/DC converter (for example, see Japanese Patent Application Laid-Open Publication No. 2004-342735 (Patent Document 1)). As the package, a QFN (Quad Flat Non-leaded package) is used, which is one of non-leaded surface-mounted packages. A tub of the package is divided to three tabs 15, 16, and 17. The high-side MOSFET 2, the low-side MOSFET 3, and the driver IC 6 are mounted on these tabs, respectively. Source pads 18 and a gate pad 19 are provided on the high-side MOSFET 2 and they are connected to the driver IC 6 via wires 7 and 8. The high-side MOSFET 2 is connected to the low-side MOSFET 3 via a wire 23 and the tab 16. Source pads 20 and 22, and a gate pad 21 are provided on the low-side MOSFET 3, and the low-side MOSFET 3 is connected to the driver IC 6 via wires 9 and 10. The low-side MOSFET 3 is connected to a power ground terminal 27 via wires 24. The tab 17 mounted with the driver IC 6 is connected to a logic ground 30 via logic ground terminals 28.

Next, influence of parasitic inductance in a main circuit will be explained. FIG. 12 is a circuit diagram showing a portion of circuit configuration of the conventional DC/DC converter, where L1 to L6 denote parasitic inductances in a main circuit. Here, L1 represents a parasitic inductance between an input power source (Vin) and a drain of the high-side MOSFET 2, namely, the sum of a wire inductance of a portion of a printed circuit board extending from the input capacitor 14 to the input terminal 25 of the system-in-package and a parasitic inductance of the tub 15 mounted with the high-side MOSFET 3. L2 represents a parasitic inductance between the source of the high-side MOSFET 2 and a reference potential of the pre-driver 4, namely, a parasitic inductance of the source electrode of the high-side MOSFET 2. L3 represents a parasitic inductance between the source of the high-side MOSFET 2 and the output terminal 26, namely, a parasitic inductance of a wire (wire 23) of the source of the high-side MOSFET 2. L4 represents a parasitic inductance between the output terminal 26 and a drain of a low-side MOSFET 3, namely, a parasitic inductance of the tab 16 mounted with the low-side MOSFET 3. L5 represents a parasitic inductance between a source of the low-side MOSFET 3 and a reference potential of the pre-driver 5, namely, a parasitic inductance of the source electrode of the low-side MOSFET 3. L6 represents a parasitic inductance between the source of the low-side MOSFET 3 and a power ground 29, namely, the sum of a parasitic inductance of a wire (wire 24) of the source of the low-side MOSFET 3 and a wire inductance of a portion of the printed circuit board extending from a power ground terminal 27 of the system-in-package 1 to the input capacitor 14.

Conventionally, it is known that reduction of the sum (L1+L2+ ... L6) of inductances in the main circuit or reduction of the parasitic inductance L2 between the high-side MOSFET 2 and the reference potential of the pre-driver 4 is effective for reduction of loss in the DC/DC converter.

In the system-in-package, since the high-side MOSFET 2 and the low-side MOSFET 3 are packaged in one package, the sum of the inductances in the main circuit can be reduced, and since the reference potential of the pre-driver 4 is applied from the source electrode of the high-side MOSFET 2 via a wire (wire 8), L2 eventually contains only the parasitic inductance of the source electrode so that L2 can be reduced considerably.

However, such a problem as a self turn-on phenomenon occurs in the DC/DC converter. The self turn-on phenomenon means a phenomenon that, when the high-side MOSFET is turned ON in an OFF state of the low-side MOSFET, a drain voltage of the low-side MOSFET rises, a charging current flows between the gate and the source of the low-side MOSFET via a feedback capacity between the gate and the drain of the low-side MOSFET according to the voltage change, and a gate voltage of the low-side MOSFET rises to exceed a threshold voltage, thereby causing erroneous turn-on of the low-side MOSFET.

FIG. 13 is a graph showing a calculation result of a voltage Vgs between the gate and the source of the low-side MOSFET. As shown in FIG. 13, it is understood that, after the low-side MOSFET is turned OFF, the gate voltage of the low-side MOSFET rises according to turning-ON of the high-side MOSFET. When the self turn-on phenomenon occurs, a large feed-through current flows from the high-side MOSFET to the low-side MOSFET so that conversion efficiency lowers largely. As an actual low-side MOSFET, a MOSFET having a high threshold voltage to a certain extent must be used so as not to cause the self turn-on phenomenon, which results in such a problem that high efficiency can not be achieved due to increase in conduction loss.

As a technique for preventing the self turn-on phenomenon, a technique where, even if a gate voltage of a low-side switch rises, the gate voltage does not exceeds a threshold voltage to be capable of preventing the self turn-on by driving the gate voltage of the low-side switch at a negative potential has been proposed, for example, in Japanese Patent Application Laid-Open Publication No. 2004-15974 (Patent Document 2). A technique where an auxiliary switch is provided between a gate and a source of a low-side MOSFET and the gate and the source are short-circuited to prevent rising of a gate voltage by making the auxiliary switch conductive at a rising time of a gate voltage of a low-side switch has been proposed in Japanese patent Application laid-Open Publication No. 2002-290224 (Patent Document 3).

SUMMARY OF THE INVENTION

However, since the technique described in Patent Document 2 or Patent Document 3 requires a circuit for generating a negative potential or an auxiliary switch additionally to prevent self turn-on phenomenon, such a problem arises that an additional member or change of a drive system is required.

In view of these circumstances, the present invention has been made for solving the above problems and an object thereof is to provide a circuit system and a mounting system where a self turn-on phenomenon can be prevented in a non-isolated DC/DC converter, particularly, a system-in-package for a DC/DC converter without newly adding a member or changing a drive system.

The above and other objects and novel characteristics of the present invention will be apparent from the description of this specification and the accompanying drawings.

The typical ones of the inventions disclosed in this application will be briefly described as follows.

The present invention is applied to a non-isolated DC/DC converter having a high-side switch, a low-side switch, a high-side pre-driver for driving the high-side switch, and a low-side pre-driver for driving the low-side switch, where a reference potential for the low-side pre-driver for driving the gate of the low-side switch is applied from a circuit except for a main circuit passing through the high-side switch and the low-side switch.

The present invention is applied to a non-isolated DC/DC converter having a system-in-package obtained by packaging a high-side switch, a low-side switch, and a driver IC where a high-side pre-driver for driving the high-side switch and a low-side pre-driver for driving the low-side switch are packaged in one chip in one package, which has a feature similar to that of the DC/DC converter described above.

The effects obtained by typical aspects of the present invention will be briefly described below.

According to the present invention, a self turn-on phenomenon can be prevented without adding any new member or changing a driving system, and loss reduction in a system can be achieved in a non-isolated DC/DC converter, particularly, a system-in-package for a DC/DC converter.

BRIEF DESCRIPTIONS OF THE DRAWINGS

DESCRIPTIONS OF THE PREFERRED EMBODIMENTS

Figure 11:
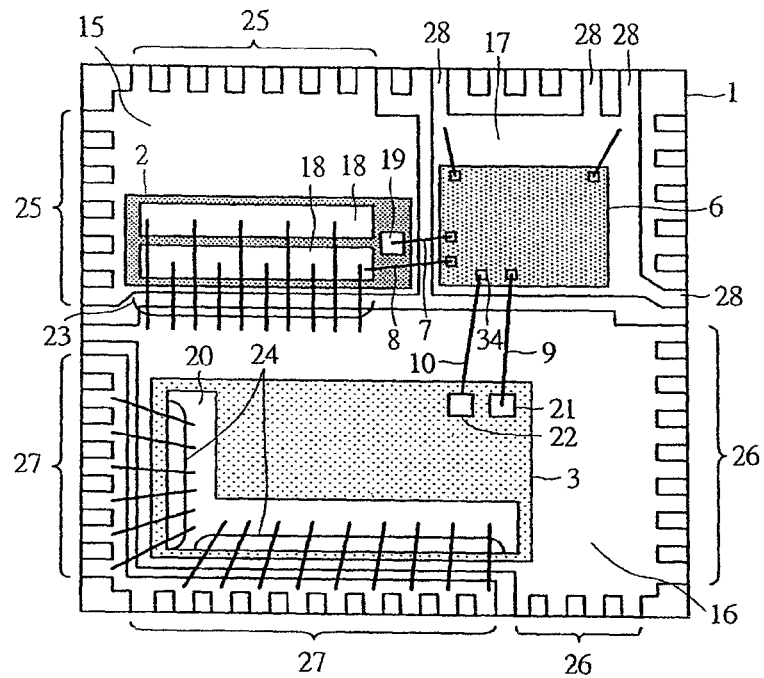
FIG. 11 is a diagram showing a configuration example of a system-in-package in the conventional DC/DC converter.
Figure 12:
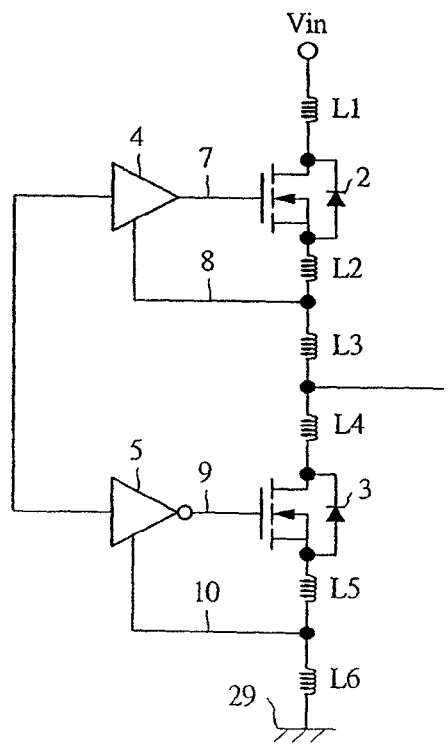
FIG. 12 is a diagram showing parasitic inductances in a main circuit in the conventional DC/DC converter.
Figure 13:
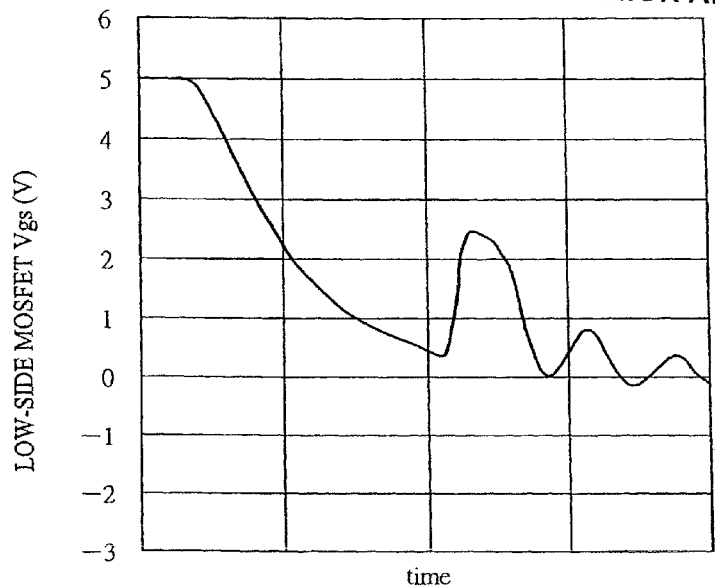
FIG. 13 is a diagram showing a calculation result of a voltage Vgs between a gate and a source in a low-side MOSFET for explaining a self turn-on phenomenon in the conventional DC/DC converter.

Hereinafter, embodiments of the present invention will be described in detail with reference to the accompanying drawings. Note that components having the same function are denoted by the same reference symbols throughout the drawings for describing the present embodiment, and the repetitive description thereof will be omitted. Same members as those in the conventional techniques (FIG. 10, FIG. 11, and FIG. 12) are attached with same reference numerals in principle, and description thereof is omitted.

(First Embodiment)

Figure 1:
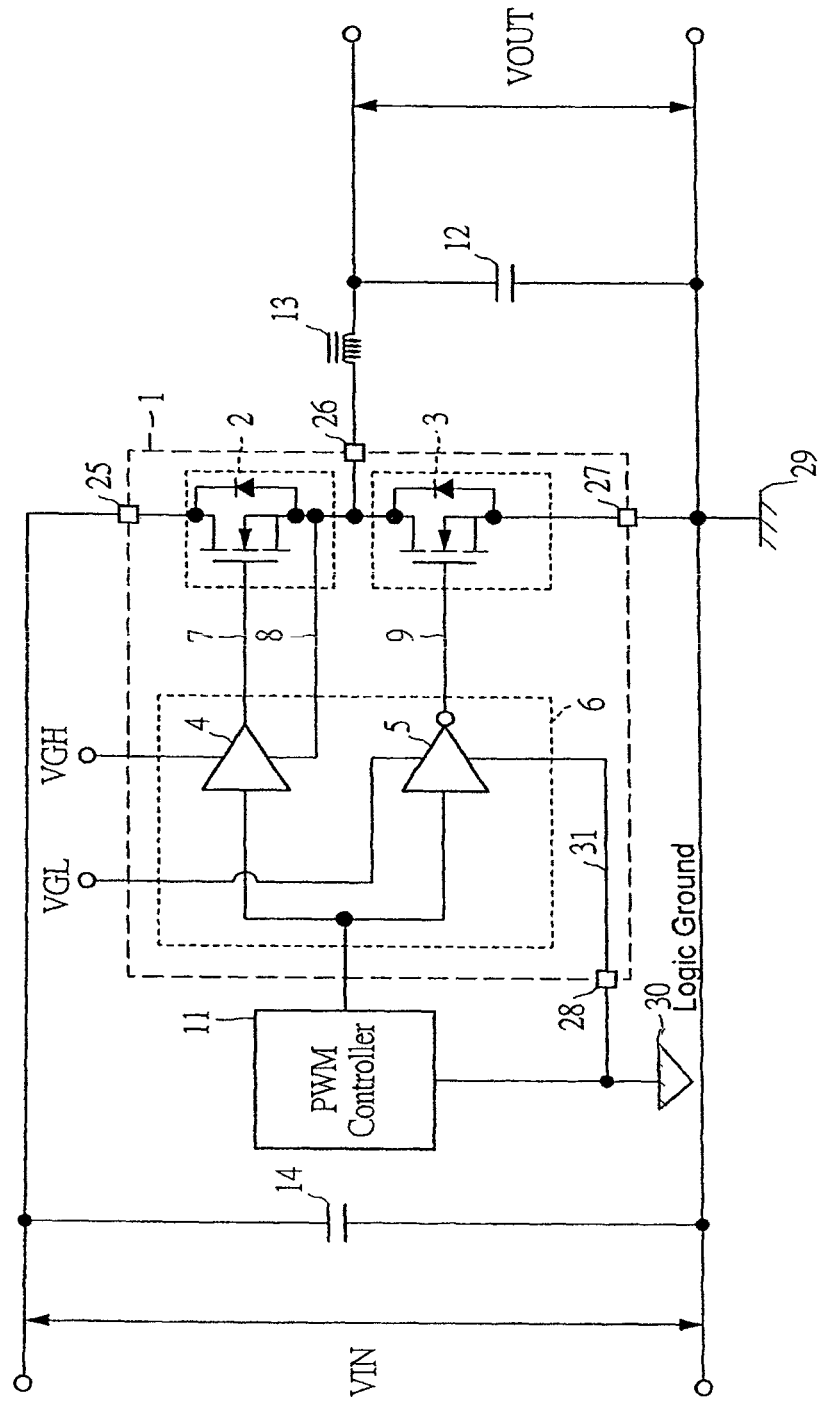
FIG. 1 is a circuit diagram showing a DC/DC converter using a system-in-package according to a first embodiment of the present invention.

FIG. 1 is a circuit diagram showing a DC/DC converter using a system-in-package according to a first embodiment of the present invention. In a DC/DC converter according to the present embodiment, a system-in-package 1 comprises a high-side MOSFET (a high-side switch) 2, a low-side MOSFET (a low-side switch) 3, a high-side pre-driver 4 for driving a gate of the high-side MOSFET 2, and a low pre-driver 5 for driving a gate of the low-side MOSFET 3, where the pre-drivers 4 and 5 are formed as a driver IC 6 in one chip, and three chips of the high-side MOSFET 2, the low-side MOSFET 3, and the driver IC 6 are mounted in one package.

Figure 10:
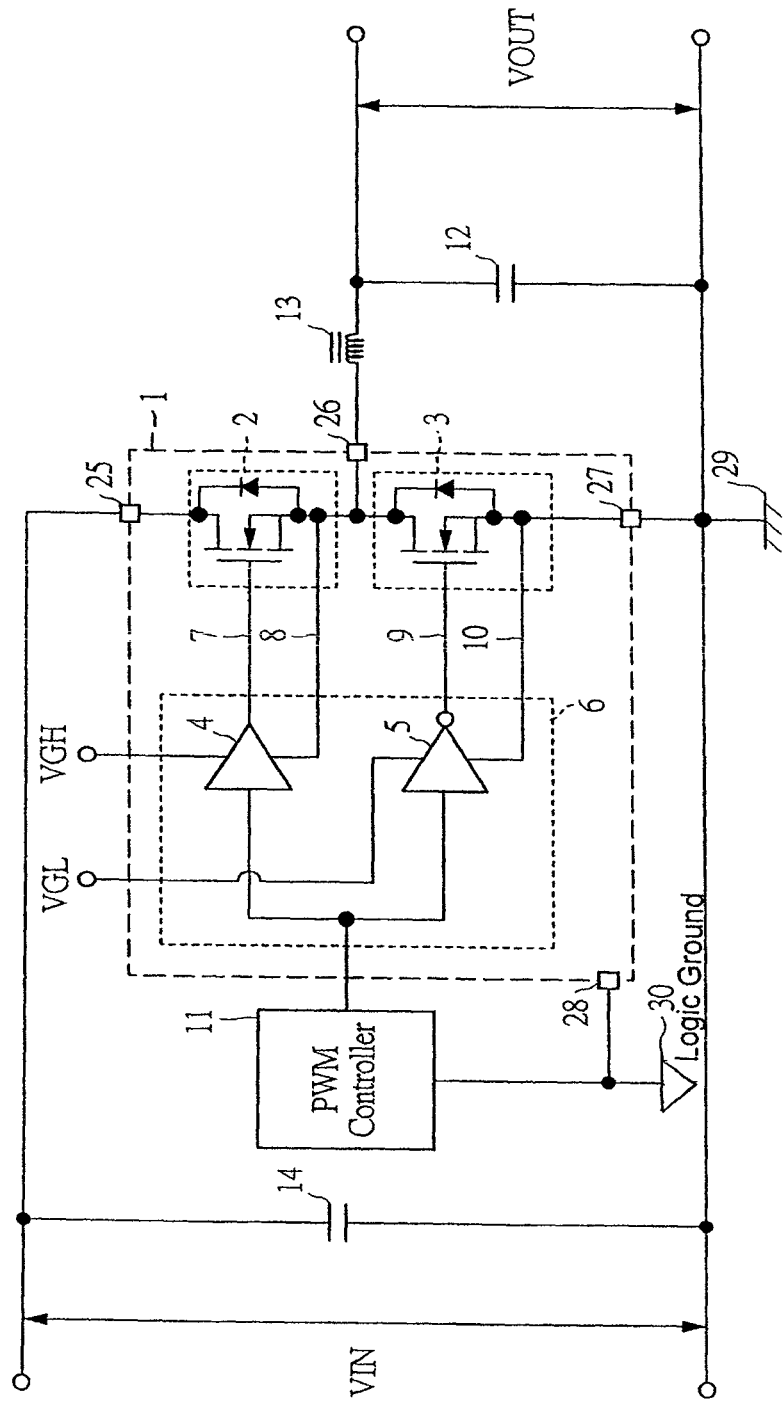
FIG. 10 is a circuit diagram showing a conventional DC/DC converter using a system-in-package.

Since an operation principle and respective constituent elements of a DC/DC converter using the system-in-package 1 are similar to those of the conventional DC/DC converter shown in FIG. 10 described above, detailed description thereof is omitted here.

A feature of the DC/DC converter of the present embodiment lies in that a reference potential for driving the low-side MOSFET 3 is not taken from a main circuit connecting the input capacitor 14, the high-side MOSFET 2 and the low-side MOSFET 3 but it is taken from a logic ground 30 using a wire 31. That is, a reference potential of the low-side pre-driver 5 is applied from a portion except for the main circuit passing through the high-side MOSFET 2 and the low-side MOSFET 3.

Figure 2:
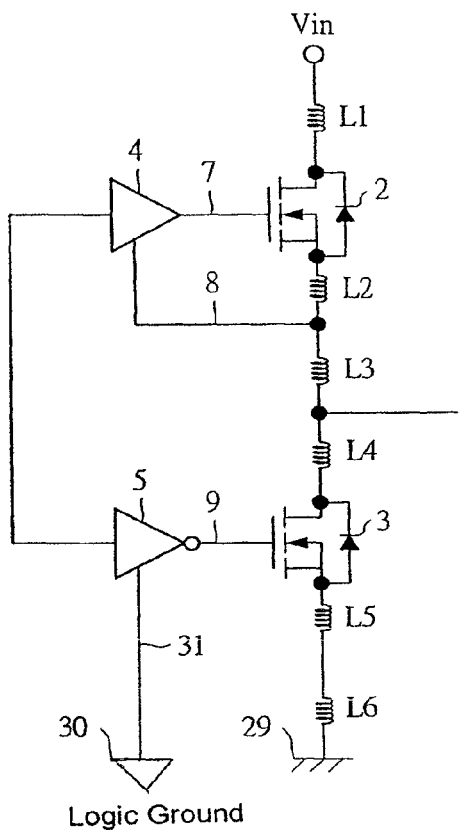
FIG. 2 is a diagram showing parasitic inductances in a main circuit in the DC/DC converter according to the first embodiment of the present invention.

FIG. 2 is a diagram showing parasitic inductances in the main circuit in the DC/DC converter according to the first embodiment. A feature of the first embodiment lies in that a parasitic inductance between the source of the low-side MOSFET 3 and the reference potential of the pre-driver 5 is increased to a large value L5+L6 without increasing the sum of the parasitic inductances in the main circuit.

Figure 14A:
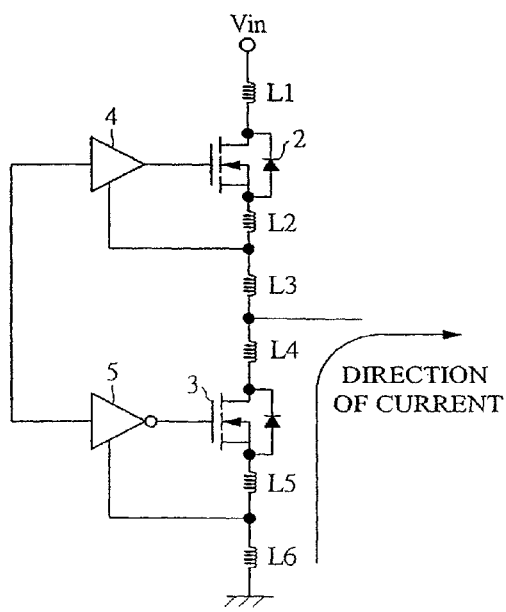
FIG. 14A is a diagram showing influence of parasitic inductances when a self turn-on phenomenon occurred in the conventional DC/DC converter.
Figure 14B:
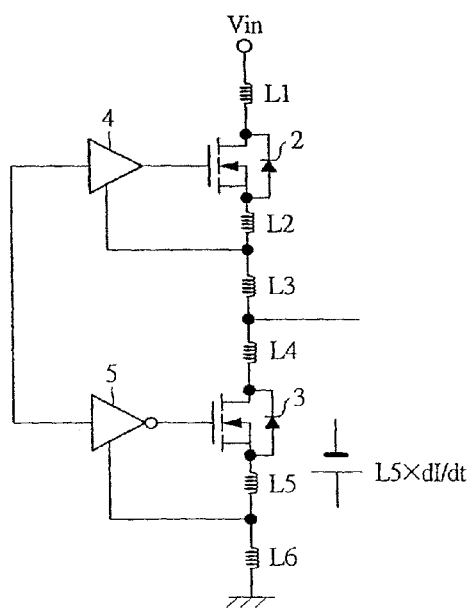
FIG. 14B is a diagram showing influence of parasitic inductances when the self turn-on phenomenon occurred in the conventional DC/DC converter.

Here, influence of the parasitic inductance between a source of a low-side MOSFET 3 and a reference potential of a pre-driver 5 in a conventional DC/DC converter (FIG. 12) will be explained with reference to FIGS. 14A and 14B. When the low-side MOSFET 3 is turned OFF, a current flows from the low-side MOSFET 3 to a built-in diode in the low-side MOSFET 3, and the current flows in a direction shown by the arrow in FIG. 14A in the OFF-state of the low-side MOSFET 3. Here, when the high-side MOSFET 2 starts turning-ON, the current flowing in the built-in diode in the low-side MOSFET 3 starts decreasing, so that an induced electromotive force L5×dI/dt across both ends of the parasitic inductance L5 occurs in a direction shown in FIG. 14B. Here, since an output voltage of the pre-driver 5 is 0 volt, a voltage applied across a gate and the source of the low-side MOSFET 3 becomes a negative potential which is −L5×dI/dt.

Figure 3:
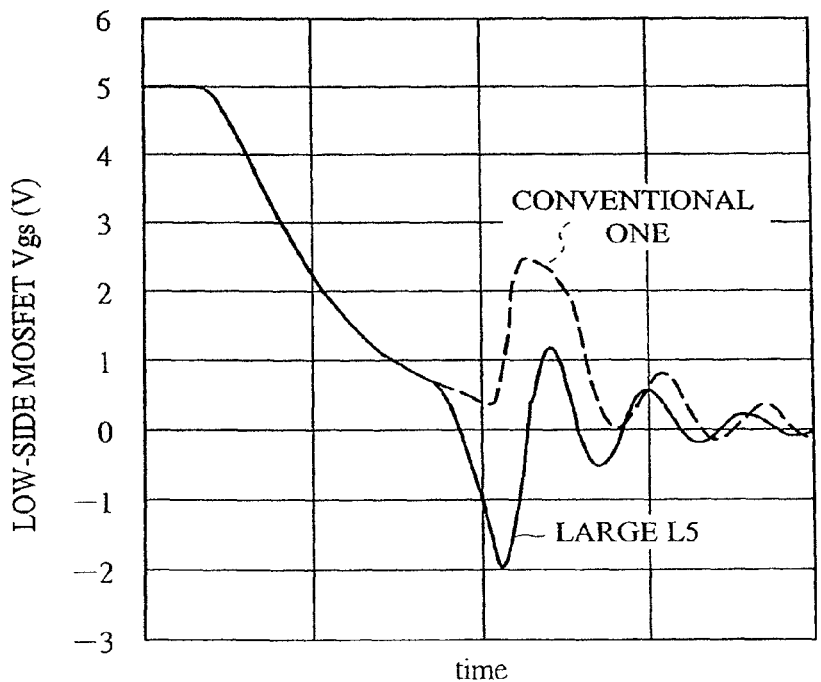
FIG. 3 is a graph showing a calculation result of a voltage Vgs between a gate and a source of a low-side MOSFET for explaining an effect of preventing self turn-on in the DC/DC converter according to the first embodiment of the present invention.

FIG. 3 is a graph showing a calculation result of a voltage Vgs between the gate and the source of the low-side MOSFET 3 obtained when L5 is changed. As shown in FIG. 3, the gate voltage is changed to a negative potential by making L5 large as shown in FIG. 3, and even if the gate voltage thereafter rises due to the self turn-on phenomenon, the rising of the voltage can be suppressed and the self turn-on phenomenon can be prevented. Thus, when the parasitic inductance L5 is increased, negative potential driving of the gate can be realized without providing an external circuit or the like, and the self turn-on can be prevented. In the conventional system-in-package, since the reference voltage for the pre-driver 5 is taken from the source electrode of the low-side MOSFET 3 using a wire 10, L5 contains only the parasitic inductance of the source electrode and it is very small.

In the first embodiment, therefore, since L6 which is a relatively large parasitic inductance is contained in the parasitic inductance between the source and the reference potential by taking the reference potential for the pre-driver 5 from the logic ground 30, an effect of the negative potential drive is made large, so that self turn-on prevention can be realized. Further, when the sum of the parasitic inductances in the main circuit is made large by making L5 large, the total loss also becomes large. However, the present embodiment provides a configuration where only the parasitic inductance between the source of the low-side MOSFET 3 and the reference potential can be made large by taking the reference voltage of the pre-driver 5 from the logic ground 30 without increasing the sum of the parasitic inductance in the main circuit.

Figure 4:
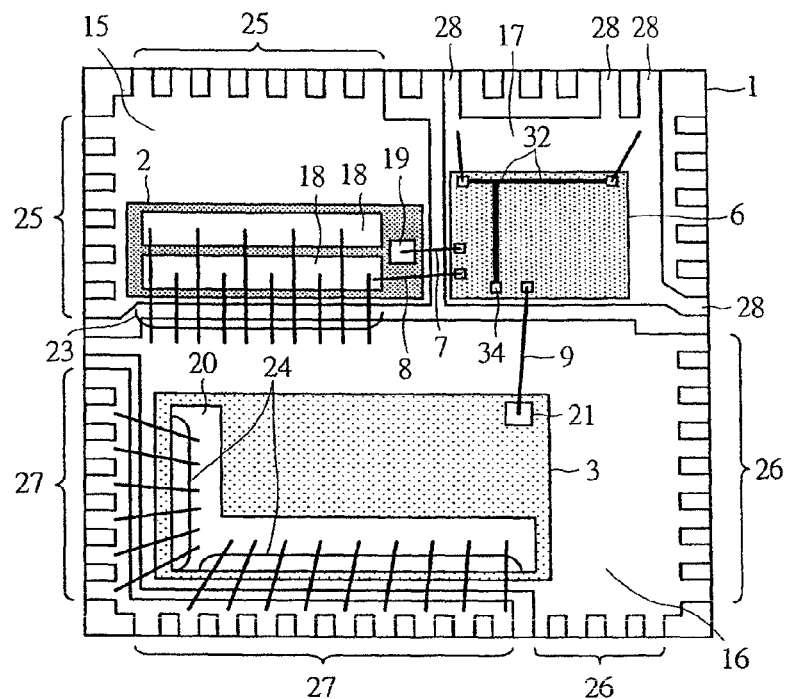
FIG. 4 is a diagram showing a configuration example of a system-in-package in the DC/DC converter according to the first embodiment of the present invention.
Figure 5:
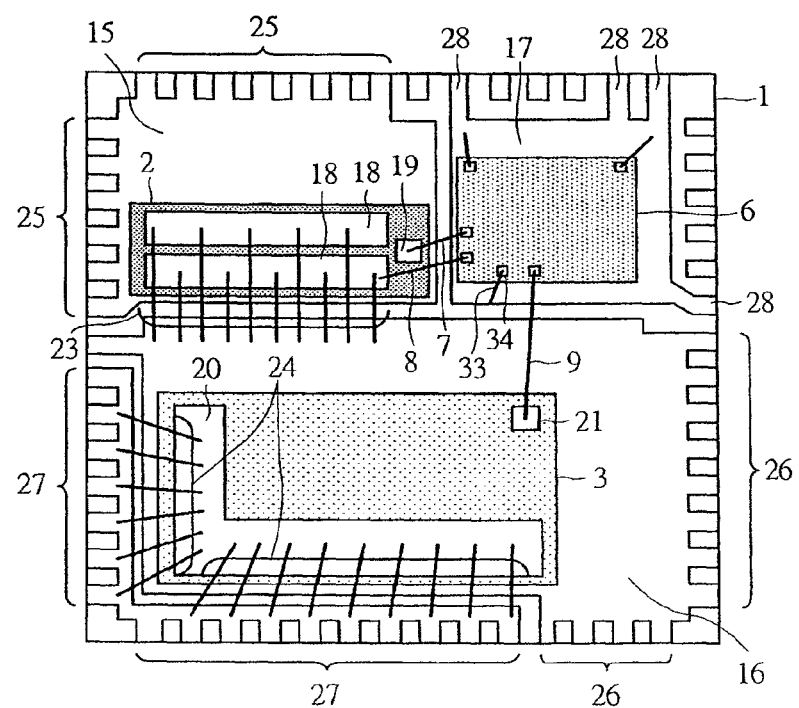
FIG. 5 is a diagram showing another configuration example of the system-in-package in the DC/DC converter according to the first embodiment of the present invention.

FIG. 4 and FIG. 5 are diagrams showing configuration examples of the system-in-package for realizing the first embodiment. In the driver IC 6 in the conventional system-in-package (FIG. 10 and FIG. 11), the reference potential of the pre-driver 5 in the low-side MOSFET 3 is put in a floating state and the potential is fixed by connecting a pad 34 of the reference potential and a source pad 22 of the low-side MOSFET 3 to each other by the wire 10. In the first embodiment, since the reference voltage in the driver IC 5 is taken from the logic ground 30, the reference potential and the logic ground are connected to each other using the wire 32 in the chip inside the driver IC 6 in the configuration shown in FIG. 4 or using the wire 33 in the tab 17 of the logic ground in the configuration shown in FIG. 5.

As explained above, according to the first embodiment, the self turn-on phenomenon can be prevented without increasing loss and loss reduction in the system can be achieved by taking the reference potential of the pre-driver 5 for driving the low-side MOSFET 3 from the logic ground 30 using the wire 32 within the chip inside the driver IC 6 or the wire 33 connected to the tab 17 of the logic ground.

(Second Embodiment)

Figure 6:
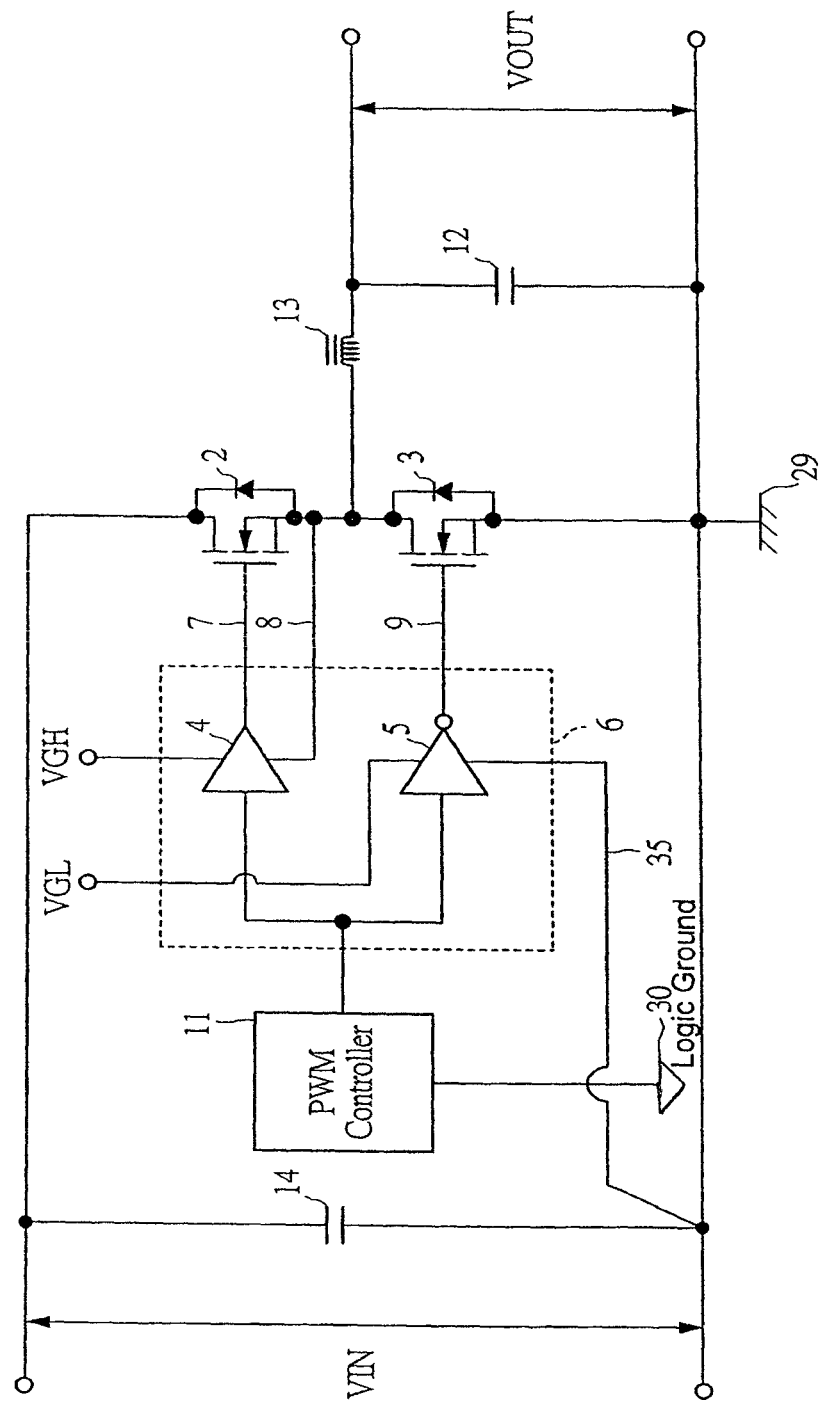
FIG. 6 is a circuit diagram showing a DC/DC converter using a discrete device according to a second embodiment of the present invention.

FIG. 6 is a circuit diagram showing a DC/DC converter using a discrete device according to a second embodiment of the present invention. A feature of the second embodiment lies in that a reference voltage for a pre-driver 5 is taken from a portion nearest to a ground terminal of an input capacitor 14 through a wire 35. The second embodiment is a technique suitable for a DC/DC converter using the conventional discrete device instead of the system-in-package.

Figure 7:
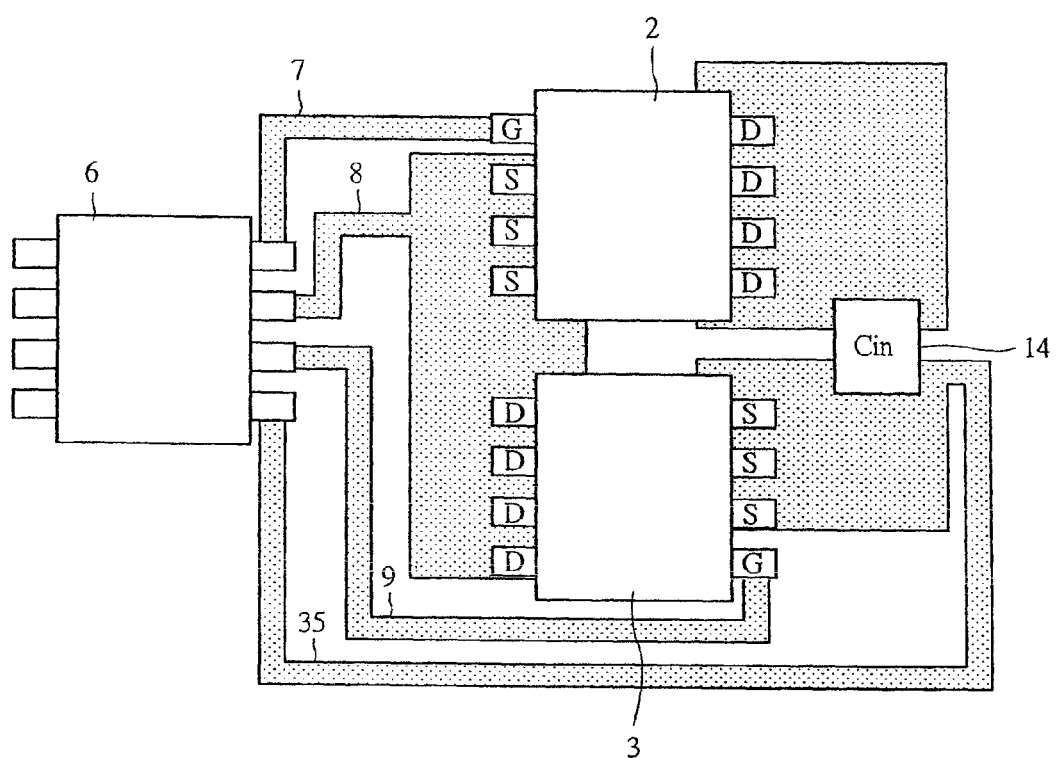
FIG. 7 is a diagram showing one example of a wiring pattern on a printed circuit board of the DC/DC converter of the second embodiment of the present invention.

FIG. 7 is a diagram showing one example of a wiring pattern of a print circuit board using the discrete device according to the second embodiment, where the reference voltage for the pre-driver 5 is taken from a portion nearest to the ground terminal of the input capacitor 14 through the wire 35 in the wiring pattern on the print circuit board. Conventionally, as shown in FIG. 15, the reference potential is taken from a portion near to the source of the low-side MOSFET 3 through the wire 10.

Figure 15:
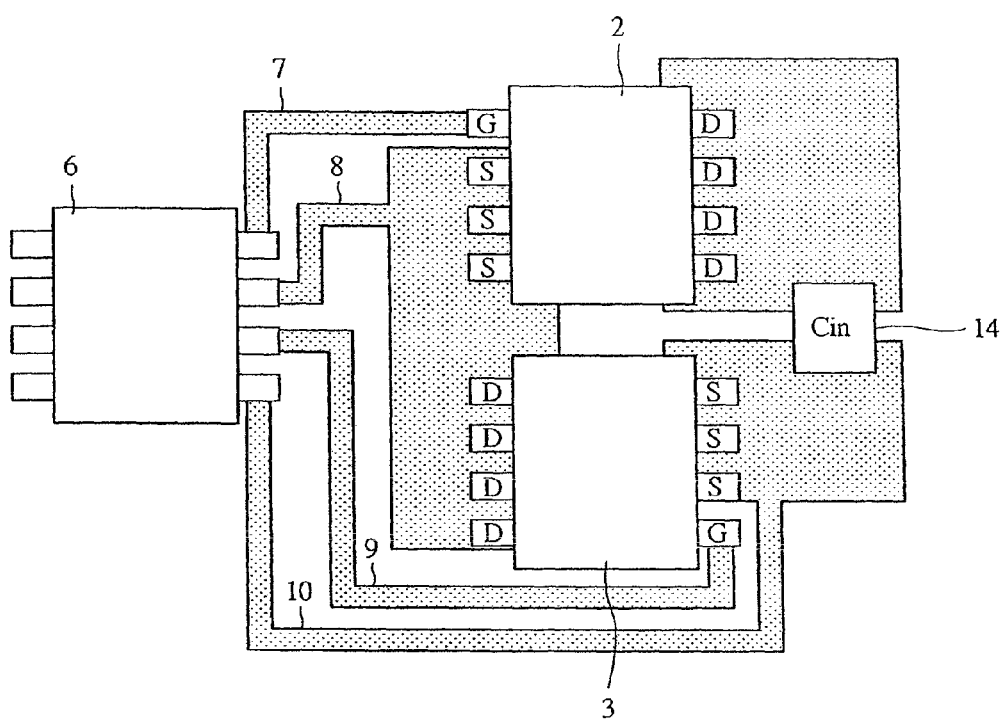
FIG. 15 is a diagram showing one example of a wiring pattern on a printed circuit board in a conventional DC/DC converter using a discrete device.

In FIG. 7 and FIG. 15, although connections utilizing planar wires are shown for easy understanding, an actual printed circuit board includes multi-layered wires, where wires from the driver IC 6 are arranged so as to make connections at the shortest distances and connections are made just below respective terminals. In the case of the discrete device, the driver IC 6 and the PWM controller 11 are frequently constituted as one chip, where the number of pins or the shape of the package may be different from those shown in FIG. 7 and FIG. 15.

As described above, according to the second embodiment, since the parasitic inductance between the source of the low-side MOSFET 3 and the reference potential of the pre-driver 5 can be made large by taking the reference potential of the pre-driver 5 from a portion nearest to the ground terminal of the input capacitor 14 through the wire 35 without increasing the sum of the parasitic inductances in the main circuit like the first embodiment, the self turn-on phenomenon can be prevented without increasing loss and loss reduction in the system can be realized.

(Third Embodiment)

Figure 8:
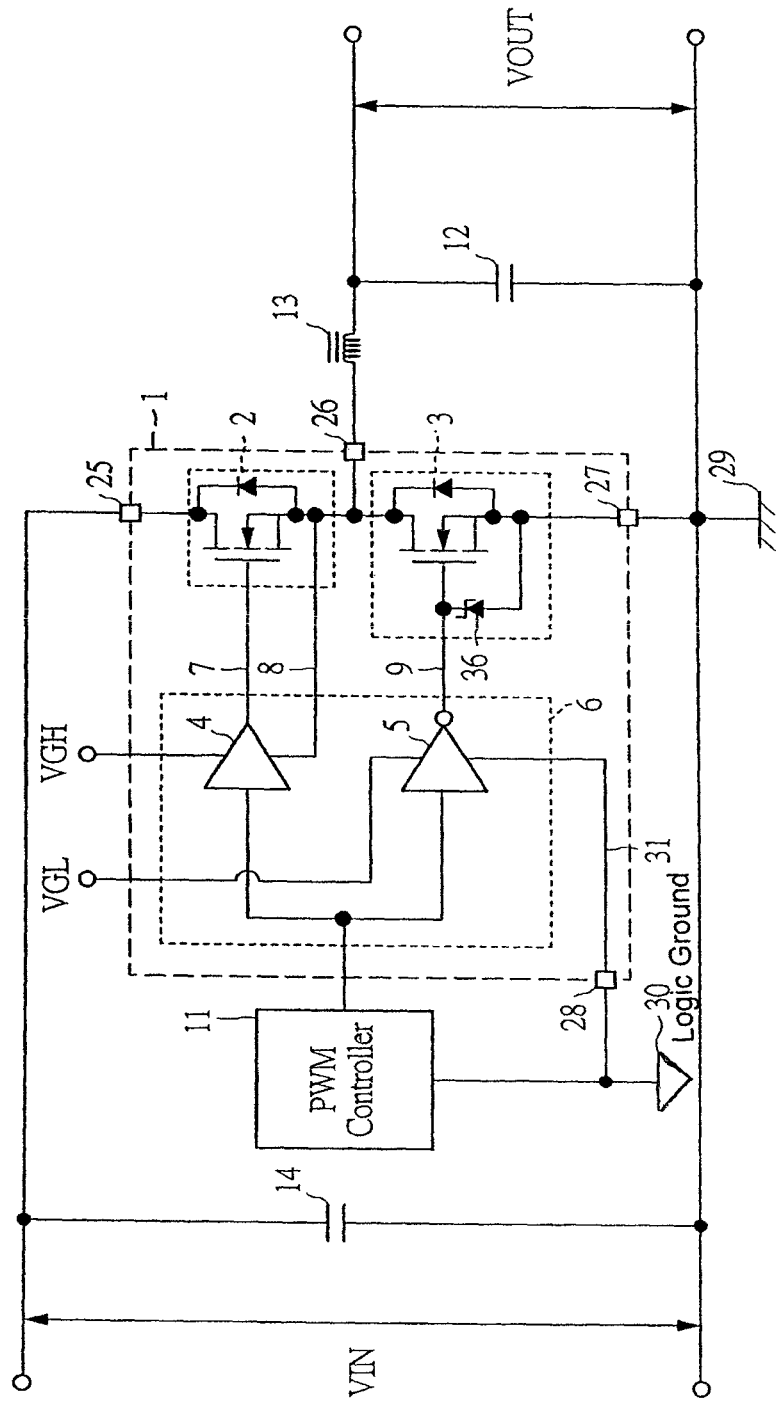
FIG. 8 is a circuit diagram showing a DC/DC converter in which an auxiliary Schottky barrier diode is built-in according to a third embodiment of the present invention.

FIG. 8 is a circuit diagram of a DC/DC converter in which an auxiliary Schottky barrier diode is built-in according to a third embodiment. A feature of the third embodiment lies in that a Schottky barrier diode (SBC) 36 is built-in between a gate and a source of a low-side MOSFET 3. In the present invention, since a gate voltage is changed to a negative potential only for a moment when self turn-on occurs and an output voltage of a pre-driver 5 is changed to a negative potential at this time, there is a possibility that a pn junction in a driver IC 6 operates so that the pre-driver 5 causes malfunction or breaking.

A feature of the third embodiment lies in that the gate voltage is clamped at −Vf which is a forward voltage of the auxiliary SBD 36 by incorporating the auxiliary SBD 36 between the gate and the source of the low-side MOSFET in order to prevent the above-described malfunction. Since the forward voltage of SBD is generally low relative to a forward voltage at the pn junction, the malfunction of the pn junction inside the driver IC 6 can be prevented by clamping the gate voltage at the forward voltage −Vf of the SBD.

Figure 9:
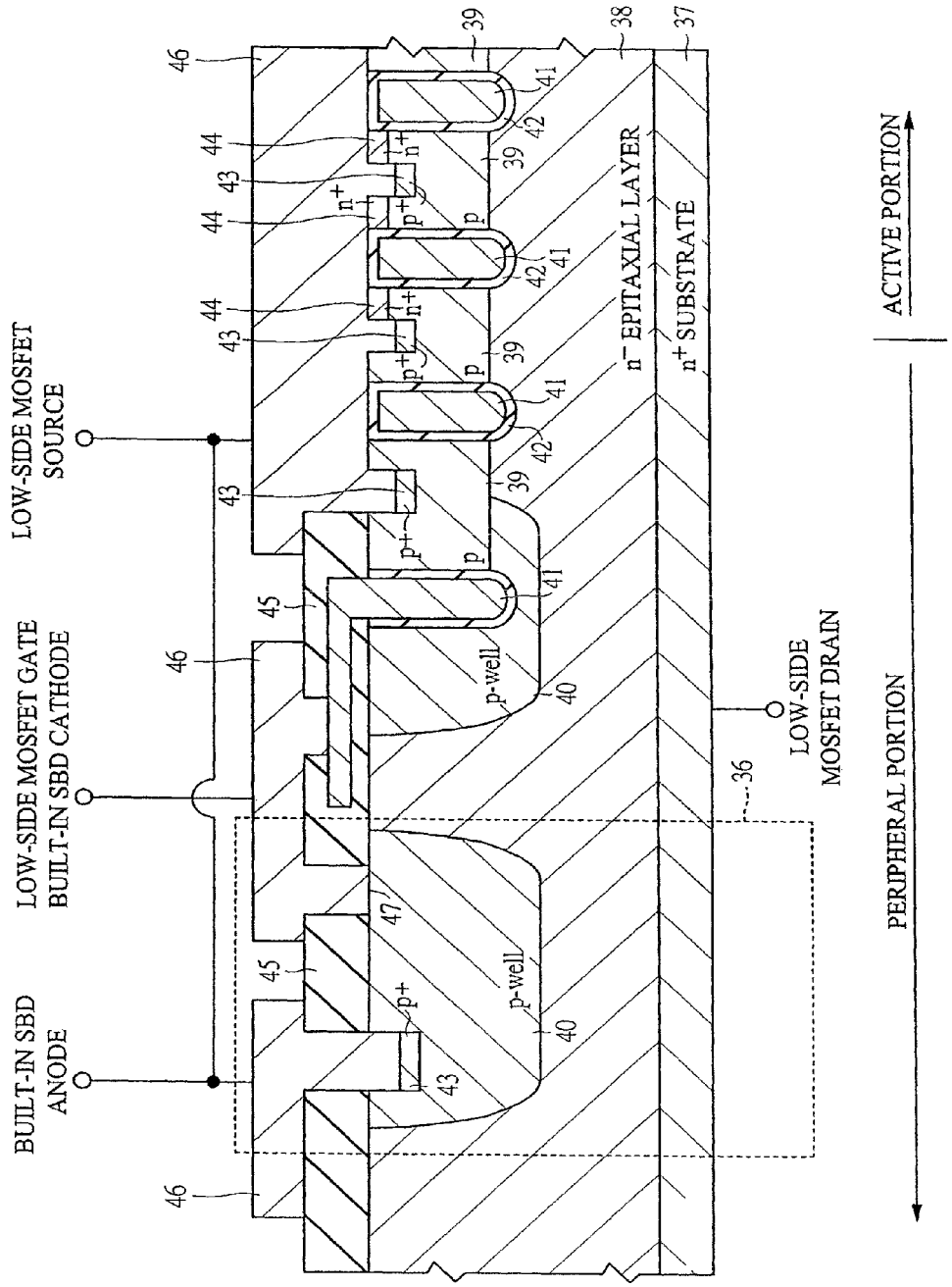
FIG. 9 is a diagram showing one example of a sectional structure of a low-side MOSFET in which the auxiliary Schottky barrier diode is built-in in the DC/DC converter of the third embodiment of the present invention.

FIG. 9 is a diagram showing one example of a sectional structure of the low-side MOSFET 3 in which the auxiliary SBD 36 is built-in. In the third embodiment, a structure of a vertical type MOSFET of a trench type is shown, but the present invention can also be applied to a planar type or a horizontal type MOSFET. In a structure of the trench type MOSFET, trench gates and channel layers 39 are formed in an n⁻ epitaxial layer 38 on an n⁺ substrate 37, and polysilicon electrodes 41 are formed in the trench gates through gate insulating films 42. P⁺ layers 43 for taking a body contact with an n⁺ layer 44 are formed in the channel layers 39. Electrodes 46 made of aluminum are formed on a surface and the electrodes 46 are separated from one another by thick insulating films 45. The SBD is formed at a device peripheral portion and, the p⁺ layer 43 and a Schottky junction 47 are formed in a deep p-type well layer 40 for obtaining peripheral withstand voltage.

The auxiliary SBD 36 can be easily built-in for forming the present device by only adding a photo process for obtaining the Schottky junction 47.

As described above, according to the third embodiment, the self turn-on phenomenon can be prevented and loss reduction in the system can be realized like the first embodiment without increasing loss, and malfunction or breaking of the pre-driver 5 can be further prevented by incorporating the auxiliary SBD 36 between the gate and the source of the low-side MOSFET 3.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a technique for a non-isolated DC/DC converter, and it can be utilized in a circuit system or a mounting system which is used in a system-in-package or a discrete device and which can prevent the self turn-on phenomenon without newly adding any member or changing a drive system.

What is claimed is:

1. A semiconductor device comprising:
   a first semiconductor chip including a high-side semiconductor switch;
   a second semiconductor chip including a low-side semiconductor switch;
   a third semiconductor chip including a high-side pre-driver configured to drive the high-side semiconductor switch and a low-side pre-driver configured to drive the low-side semiconductor switch;
   a first tab which is electrically connected to an input terminal and over which the first semiconductor chip is mounted;
   a second tab which is electrically connected to an output terminal and over which the second semiconductor chip is mounted;
   a third tab which is electrically connected to a logic ground terminal and over which the third semiconductor chip is mounted; and
   a power ground terminal which is different from the logic ground terminal and which is electrically independent of the logic ground terminal,
   wherein the first tab and a drain terminal of the first semiconductor chip are electrically connected,
   wherein the second tab and a source terminal of the first semiconductor chip are electrically connected,
   wherein the second tab and a drain terminal of the second semiconductor chip are electrically connected,
   wherein the power ground terminal and a source terminal of the second semiconductor chip are electrically connected,
   wherein a gate driving terminal of the high-side pre-driver of the third semiconductor chip is electrically connected to a gate of the high-side semiconductor switch of the first semiconductor chip via a first bonding wire,
   wherein a reference potential terminal of the high-side pre-driver of the third semiconductor chip is electrically connected to a source of the high-side semiconductor switch of the first semiconductor chip via a second bonding wire,
   wherein a gate driving terminal of the low-side pre-driver of the third semiconductor chip is electrically connected to a gate of the low-side semiconductor switch of the second semiconductor chip via a third bonding wire, and
   wherein a reference potential terminal of the low-side pre-driver of the third semiconductor chip is electrically connected to the third tab for the logic ground terminal via a fourth bonding wire to provide a reference potential to the low-side pre-driver of the third semiconductor chip independently of a ground potential of the power ground terminal to prevent a self-turn-on phenomenon, and wherein the first, second, and third semiconductor chips, a part of each of the first, second, and third tabs, and the first, second, and third bonding wires are packaged in one package.

2. The semiconductor device according to claim 1,
wherein the power ground terminal is a terminal electrically connectable with a ground terminal of an output voltage at the outside of the semiconductor device, and
wherein the logic ground terminal is a terminal electrically connectable with ground terminal of a PWM controller supplying a PWM signal from outside of the semiconductor device.

3. The semiconductor device according to claim 1,
wherein the third bonding wire extending from the gate driving terminal of the low-side pre-drive and the fourth bonding wire extending from the reference potential terminal of the low-side pre-driver are arranged adjacently to each other.

4. A semiconductor device comprising:
a first semiconductor chip including a high-side power MOSFET and having a first main surface and a second main surface opposite the first main surface, a first source electrode pad and a first gate electrode pad are formed over the first main surface, a first drain electrode is formed over the second main surface;
a second semiconductor chip including a low-side power MOSFET and having a first main surface and a second main surface opposite the first main surface, a second source electrode pad and a second gate electrode pad are formed over the first main surface and a second drain electrode is formed over the second main surface;
a third semiconductor chip including a high-side pre-driver configured to drive the high-side power MOSFET and a low-side pre-driver configured to drive the low-side power MOSFET and having a first main surface;
a plurality of power input terminals;
a plurality of output terminals;
a plurality of power ground terminals which are electrically connected to the second source electrode pad;
a plurality of logic ground terminals which are different from the power ground terminals and electrically separated from the power ground terminals;
a first tab over which the first semiconductor chip is mounted and which is electrically connected to the first drain electrode and the power input terminals;
a second tab which over which the second semiconductor chip is mounted and which is electrically connected to the second drain electrode, the first source electrode pad and the output terminals; and
a third tab which is electrically connected to the logic ground terminals and on which the third semiconductor chip is mounted,
wherein a first pad and a first reference potential pad electrically connected to the high-side pre-driver are formed over the first main surface of the third semiconductor chip,
wherein the first pad is electrically connected to the first gate electrode pad of the first semiconductor chip via a first bonding wire,
wherein the first reference potential pad is electrically connected to the first source electrode pad of the first semiconductor chip,
wherein a second pad and a second reference potential pad electrically connected to the low-side pre-driver are formed over the first main surface of the third semiconductor chip,
wherein the second pad is electrically connected to the second gate electrode pad of the second semiconductor chip via a second bonding wire,
wherein the second reference potential pad is electrically connected to the third tab for the logic ground terminals via a third bonding wire to provide a reference potential to the low-side pre-driver of the third semiconductor chip independently of a ground potential of the power ground terminals to prevent a self-turn-on phenomenon, and
wherein the first, second and third semiconductor chips, a part of the first, second, and third tabs, and the first, second and third bonding wires, are packaged in one non-leaded surface-mounted package,
wherein the one non-leaded surface-mounted package has a first side, a second side which intersects the first side, a third side opposite the first side and which intersects the second side, and a fourth side opposite the second side and which intersects the first and third sides,
wherein each of the plurality of power ground terminals is located on the first and second sides,
wherein each of the plurality of output terminals is located on the second and the third sides,
wherein each of the plurality of the logic ground terminals is located on the third side and fourth sides, and
wherein each of the plurality of the power input terminals is located on the first and fourth sides.

5. The semiconductor device according to claim 4,
wherein the first source electrode pad of the semiconductor chip is electrically connected to the first reference potential pad of the third semiconductor chip via a fourth bonding wire.

6. The semiconductor device according to claim 4,
wherein the second tab is electrically connected to the first source electrode pad of the first semiconductor chip via a fifth bonding wire.

7. The semiconductor device according to claim 4,
wherein the power ground terminal is electrically connected to the second source electrode pad of the second semiconductor chip via a sixth bonding wire.

8. The semiconductor device according to claim 4,
wherein a length of the second bonding wire is longer than a length of the first bonding wire.

* * * * *

UNITED STATES PATENT AND TRADEMARK OFFICE
CERTIFICATE OF CORRECTION

PATENT NO. : 8,638,577 B2  Page 1 of 1
APPLICATION NO. : 13/230947
DATED : January 28, 2014
INVENTOR(S) : Shiraishi et al.

It is certified that error appears in the above-identified patent and that said Letters Patent is hereby corrected as shown below:

On the Title Page: Item (45) Date of Patent should read:   Jan. 28, 2014*

Signed and Sealed this
Tenth Day of June, 2014

Michelle K. Lee
*Deputy Director of the United States Patent and Trademark Office*